United States Patent [19]

Maserjian et al.

[11] 4,090,213
[45] May 16, 1978

[54] INDUCED JUNCTION SOLAR CELL AND METHOD OF FABRICATION

[75] Inventors: Joseph Maserjian, LaCrescenta; Shy Shiun Chern, Los Angeles; Seung P. Li, San Dimas, all of Calif.

[73] Assignee: California Institute of Technology, Pasadena, Calif.

[21] Appl. No.: 696,374

[22] Filed: Jun. 15, 1976

[51] Int. Cl.² .................................. H01L 27/14
[52] U.S. Cl. ...................... 357/30; 357/52; 357/91; 148/1.5
[58] Field of Search ............. 357/30, 52, 91; 148/1.5

[56] References Cited

U.S. PATENT DOCUMENTS

| | | | |
|---|---|---|---|
| 3,564,355 | 2/1971 | Lehovec | 317/235 |
| 3,601,668 | 8/1971 | Slaten | 317/234 R |
| 3,657,614 | 4/1972 | Crichi | 317/235 R |
| 3,888,698 | 6/1975 | Lindmayer | 136/89 |
| 3,911,465 | 10/1975 | Foss | 357/23 |
| 3,922,774 | 12/1975 | Lindmayer | 29/572 |

*Primary Examiner*—Martin H. Edlow
*Attorney, Agent, or Firm*—Lindenberg, Freilich, Hornbaker, Wasserman, Rosen & Fernandez

[57] ABSTRACT

An induced junction solar cell is fabricated on a p-type silicon substrate by first diffusing a grid of criss-crossed current collecting n+ stripes and thermally growing a thin SiO₂ film, and then, using silicon-rich chemical vapor deposition (CVD), producing a layer of SiO₂ having inherent defects, such as silicon interstices, which function as deep traps for spontaneous positive charges. Ion implantation increases the stable positive charge distribution for a greater inversion layer in the p-type silicon near the surface. After etching through the oxide, to parallel collecting stripes, a pattern of metal is produced consisting of a set of contact stripes over the exposed collecting stripes and a diamond shaped pattern which functions as a current collection bus. Then the reverse side is metallized.

21 Claims, 5 Drawing Figures

INDUCED JUNCTION SOLAR CELL AND METHOD OF FABRICATION

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to photovoltaic devices, and more particularly to an induced junction semiconductor structure for use as a solar cell.

There is a continuing need for solar cells of high efficiency and reliability to power electronic systems in space vehicles, and an emerging need for high-efficiency solar cells for use on Earth in place of more conventional sources of energy. The most efficient solar cell which has been produced is basically comprised of a diffused silicon p-n junction. Since Chapin, Fuller and Pearson first reported the development of such a solar cell in "A New Silicon p-n Junction Photocell for Converting Solar Radiation into Electrical Power," J. Appl. Phys. Vol. 25, 676 (1954), other semiconductor materials, such as GaAs and In, P, have been used. However, silicon is perhaps the most widely used because of the high efficiencies achieved and the ease with which silicon devices can be produced even though other materials have higher predicted efficiencies at different temperatures from below room temperature to as high as 400° C.

The operation of a diffused p-n junction solar cell is based upon hole-electron pair generation by photons and migration of minority carriers on each side to the other side (i.e., migration of electrons from the p side to the n side and holes from the n side to the p side.) Recombination of hole-electron pairs in the depletion region of the p-n junction reduces the efficiency of the solar cell to a range of about 10% to 15%, about half the efficiency that is theoretically possible.

Professor R. L. Call of the University of Arizona in Tucson, Arizona, has proposed an induced junction at the surface of a silicon wafer for use as a solar cell. The structure fabricated and tested consisted of p-type silicon in which two n-diffused strips were employed as contacts to an inversion region between them. The inversion region in the silicon was achieved by a transparent sheet electrode deposited over a thermally grown oxide layer. The sheet overlaps the diffused stripes to assure an inversion region from one stripe to the other. Aluminum contacts are evaporated over the stripes in order to connect a load to the cell. A positive potential applied to the transparent electrode induces an inversion layer near the surface of the silicon wafer. The inversion layer induces a junction, and the result is a metal-insulator-silicon (MIS) diode which then operates like a p-n junction diode as a solar cell.

As an alternative to the transparent conductive film over the oxide insulator used as an electrode to apply an electric field, Professor Call has suggested purposely placing ions from contaminants in the oxide insulator, such as ionized sodium. Increasing the thickness of the oxide layer, with uniform distribution of ions, increases the total charge density and therefore increases the inversion layer. However, using dopants like sodium are unsatisfactory because the charge distribution is unstable at operating temperatures.

OBJECTS AND SUMMARY OF THE INVENTION

An object of this invention is to provide an improved method of producing induced-junction solar cells with a charge distribution in an oxide film.

Still another object is to provide an improved structure for an induced-junction solar cell.

Yet another object is to provide a method and structure for practical fabrication of induced-junction solar cells.

These and other objects of the invention are achieved by fabricating solar cells on a substrate of semiconductor material, such as silicon, appropriately doped with a suitable dopant, such as boron atoms for p-type silicon, or phosphorous atoms for n-type silicon. A thermal oxide film is first produced on the obverse side. Then a crisscrossed striped pattern is opened in the oxide film and the substrate is doped with a dopant of an opposite type, such as phosphorous atoms in the case of a p-type silicon substrate. The crisscrossed stripes thus formed serve as current collectors. Stripes of different orientations have different widths. The set of stripes with narrower widths function as auxiliary collecting stripes, and the other set function as primary collecting stripes. The crisscrossed oxide film is removed and a new thermal oxide film is produced on the entire obverse side of the substrate. This is followed by first chemical vapor deposition of an oxide layer on the entire surface of the oxide film, and then ion implantation over the entire oxide layer. The oxide layer and film is removed over primary collecting stripes. Metallization of the entire structure on the obverse side follows. The deposited metal is etched away using a mask of such a pattern as to leave metal stripes over the primary collecting stripes where the oxide layer and film have been removed, and at least one diamond shaped bus bar making contact with the metal stripes. The diamond shaped pattern includes extensions at opposite corners running to other diamond shaped patterns in the case of a number of such solar cells produced on one substrate, or to connecting pads in the case of only one diamond shaped pattern and in the case of end diamond shaped patterns where more than one is included. The bus bars of the diamond shaped pattern taper to points at the remaining corners which are chosen to be opposite each other in a direction parallel to the primary collecting stripes. A load may be connected to a solar cell thus produced by connecting one terminal thereof to the diamond shaped bus bars on the obverse side and the other terminal to the metal film on the reverse side.

DESCRIPTION OF PREFERRED EMBODIMENTS

Figure 1:
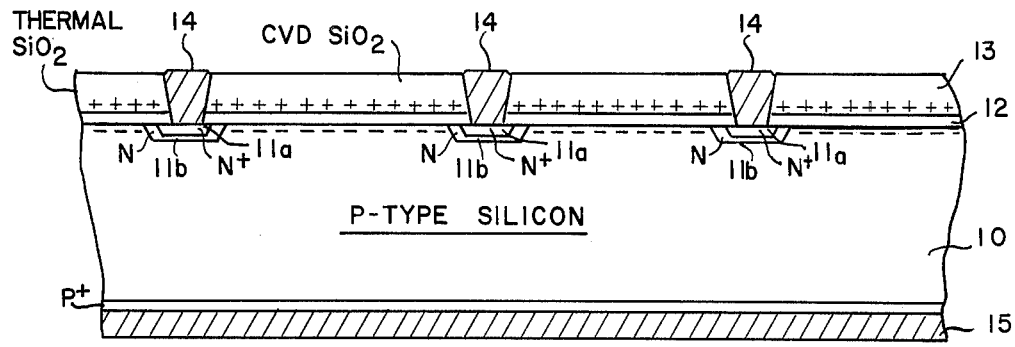
FIG. 1 is a cross section of an induced junction solar cell fabricated in accordance with the present invention.

Referring now to FIG. 1 of the drawings, a substrate 10 of p-type silicon is provided with $n^+$ stripes 11a in the center of each of a plurality of wider n-type parallel primary collecting stripes 11b. The primary collecting stripes cross parallel auxiliary collecting stripes in a rectangular grid pattern, as will be described more fully hereinafter. The n-type collecting stripes in both directions are uniformly spaced about 10 mils apart. A thermal oxide film 12 is provided as an insulator over the striped substrate, and a chemical-vapor deposition (CVD) layer 13 is provided over the oxide film. Positive ions are implanted in the CVD layer with a uniform density of at least about $0.5 \times 10^{12}/cm^2$. Stripes about 1 mil wide are etched through the CVD layer and the thermal oxide film over the $n^+$-type primary collecting stripes 11b. Then aluminum conductors 14 are deposited in the primary collecting stripe openings. An aluminum film 15 deposited on the reverse side completes the solar cell.

If all of the aluminum stripes over a $2 \times 2$ cm area are connected together, a total short-circuited current to the aluminum film 15 is produced of approximately 170 ma for 140 milliwatts/cm² illumination, i.e., for one sun illumination. This compares favorably with conventional p-n junction solar cells which average approximately 135 ma under the same conditions. This improved solar cell structure depends upon a fixed charge distribution in the CVD layer forming an inversion layer near the surface of the silicon substrate 10. Operation of the solar cell is then very much like in a p-n junction solar cell with a junction induced by the inversion layer replacing a diffused layer in the p-n junction solar cell.

The greater total current produced by an induced junction solar cell is believed to be due to the fact that an inversion layer is induced that is just sufficient and stable. The silicon rich CVD $SiO_2$ inherently has interstices. These silicon interstitial defects are capable of producing spontaneous charge distributions of the desired type with surprisingly good thermal stability. (These interstitial defects are believed to be deep traps for positive charges.) The density of the charge distribution in the CVD layer is then increased by ion implantation at a slow rate. In other words, the dispersed defects in the CVD layer function as though they were donor impurities of very high concentration. However, only a small portion of the distributed defects is spontaneously ionized. Therefore slow ion implantation is used to increase the charge density in the CVD layer.

Figure 2:
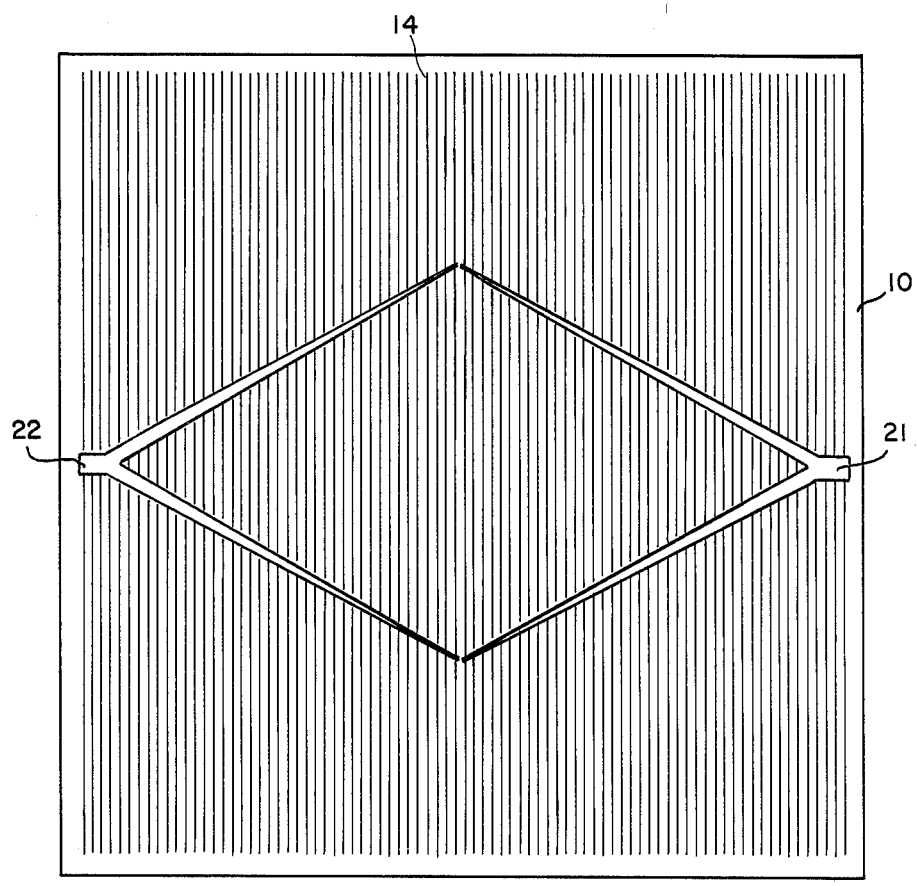
FIG. 2 is a plan view of a solar cell fabricated in accordance with FIG. 1.

Before proceeding with a description of a preferred process for producing induced junction solar cells with a CVD layer and implanted ions, the preferred geometry for the metal pattern used to collect current will be further described with reference to FIG. 2, which is a plan view of the obverse side of a solar cell. As noted hereinbefore, the substrate 10 is prepared with a rectangular grid of n-type stripes spaced apart about 10 mils in both directions. Once the stripes are diffused, the oxide diffusing mask is removed chemically and a new thin oxide film is thermally produced. That is followed by chemical vapor deposition of the silicon oxide layer and ion implantation. Parallel stripes are then etched through the thermal oxide film and the CVD oxide layer directly over the stripes in only one direction of the n-type diffused grid pattern. The $n^+$ diffusion is then made in the center of these stripes, the primary collecting stripes which are slightly wider than the n-type stripes in the other direction, i.e., than the auxiliary collecting stripes. Aluminum metallization of the entire obverse side of the structure is then followed by etching of the aluminum film through a mask to leave only conductors over the $n^+$ stripes and an interconnecting diamond shaped pattern comprised of bifurcated bus bars 21 and 22. The wider root section of each bus bar is about $20 \times 20$ mils, large enough to function as a contact pad, and the two branches of each bus bar are tapered as shown. The points of the branches of one bus bar are directly opposite the points of the branches of the other bus bar, but they do not connect. They could be allowed to connect, but it is preferred that each point terminate over an exposed $n^+$ diffused stripe and not extend over the space between stripes for test purposes in order to provide an evaluation of the inversion layer. This pattern of $n$ and $n^+$ stripes with metal conductors over the $n^+$ stripes interconnected by the diamond-shaped bus bar has been selected to minimize the total area covered by metal and maximize the current collecting efficiency.

Figure 3:
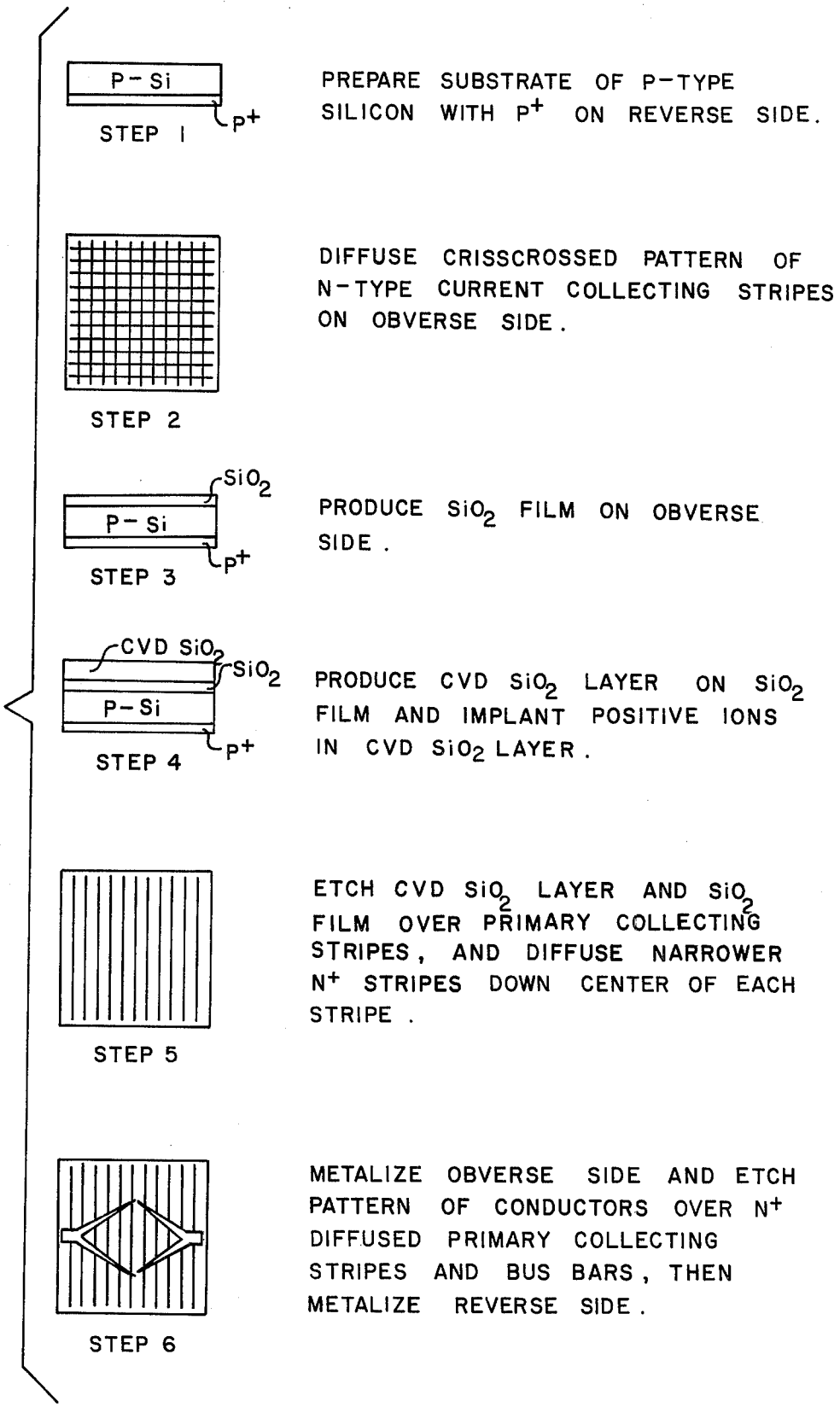
FIG. 3 illustrates the major steps of the process for producing a solar cell in accordance with FIG. 1.

Referring now to FIG. 3, the general process will be described with reference in the drawing to only major steps. All other major steps not illustrated in the drawing are obvious and conventional in the fabrication of planar semiconductor devices. Some minor steps will nevertheless be included in the discussion.

Before the first step in the drawing, a wafer of p-type <100> silicon (1–3 ohms cm) is cleaned and subjected to a high temperature (1175°) in an atmosphere of oxygen to deplete diffusion on the obverse side and produce a thermal oxide film (15.7 KA). The oxide on the reverse side is then etched and the exposed wafer is cleaned just prior to $p^+$ deposition at a high temperature (1050° C of boron in an atmosphere of nitrogen for 60 minutes). This prepares the reverse side for ultimately making a ground contact with the metal film 15. The obverse side is then prepared for diffusing the n-type grid pattern to about 80 ohms/cm² using a phosphorous gas ($PH_3$). Following that, the obverse side is prepared to etch the $n^+$ stripes to about 10 ohms/cm². Any oxide film produced during diffusion of stripes is etched, and the oxide film 12 is produced to a thickness of about 100A by heating to 900° in an atmosphere of oxygen.

Figure 4:
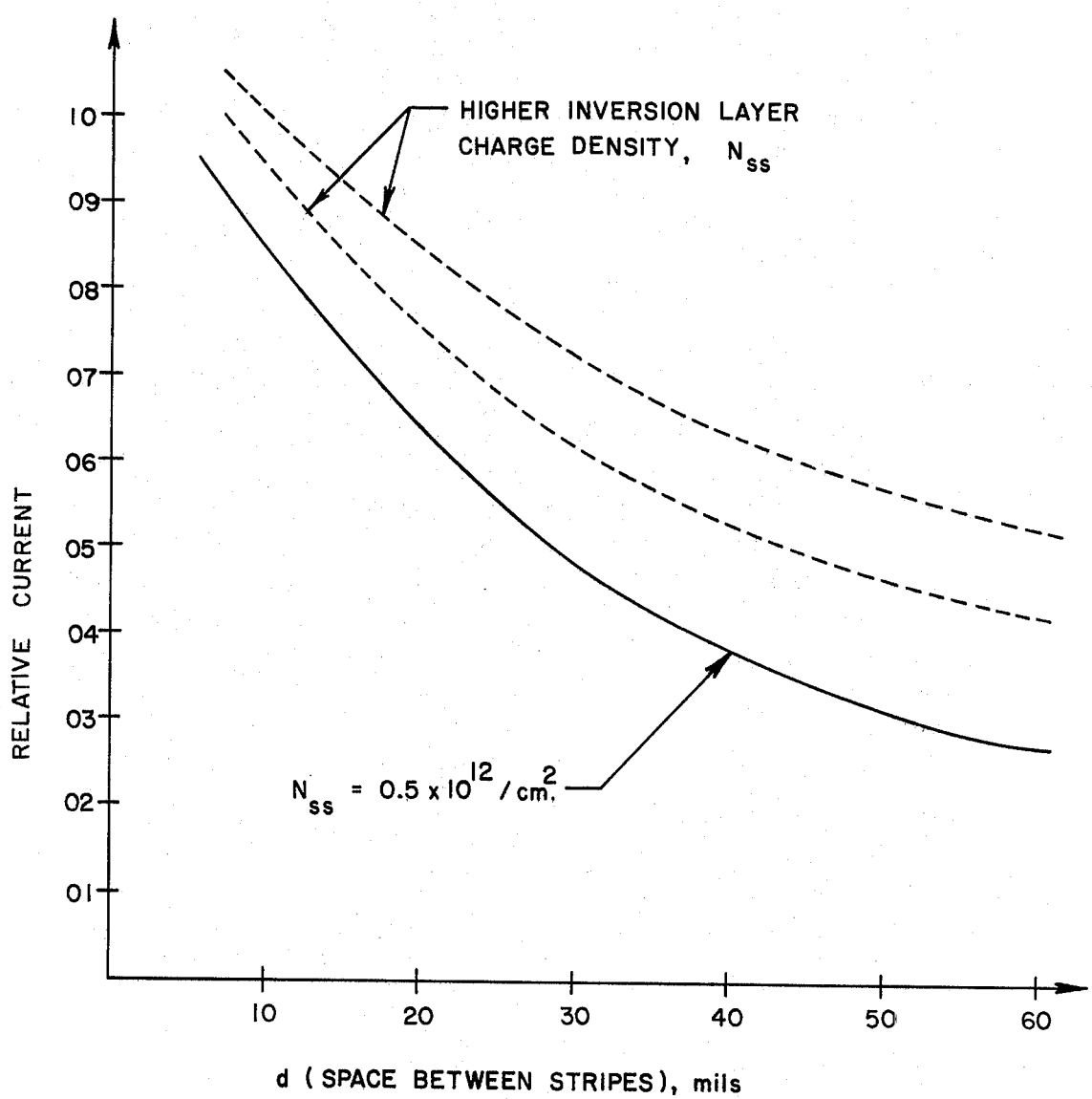
FIG. 4 is a graph of current collecting efficiency as a function of collector stripe spacing and inversion layer charge density, Nss.
Figure 5:
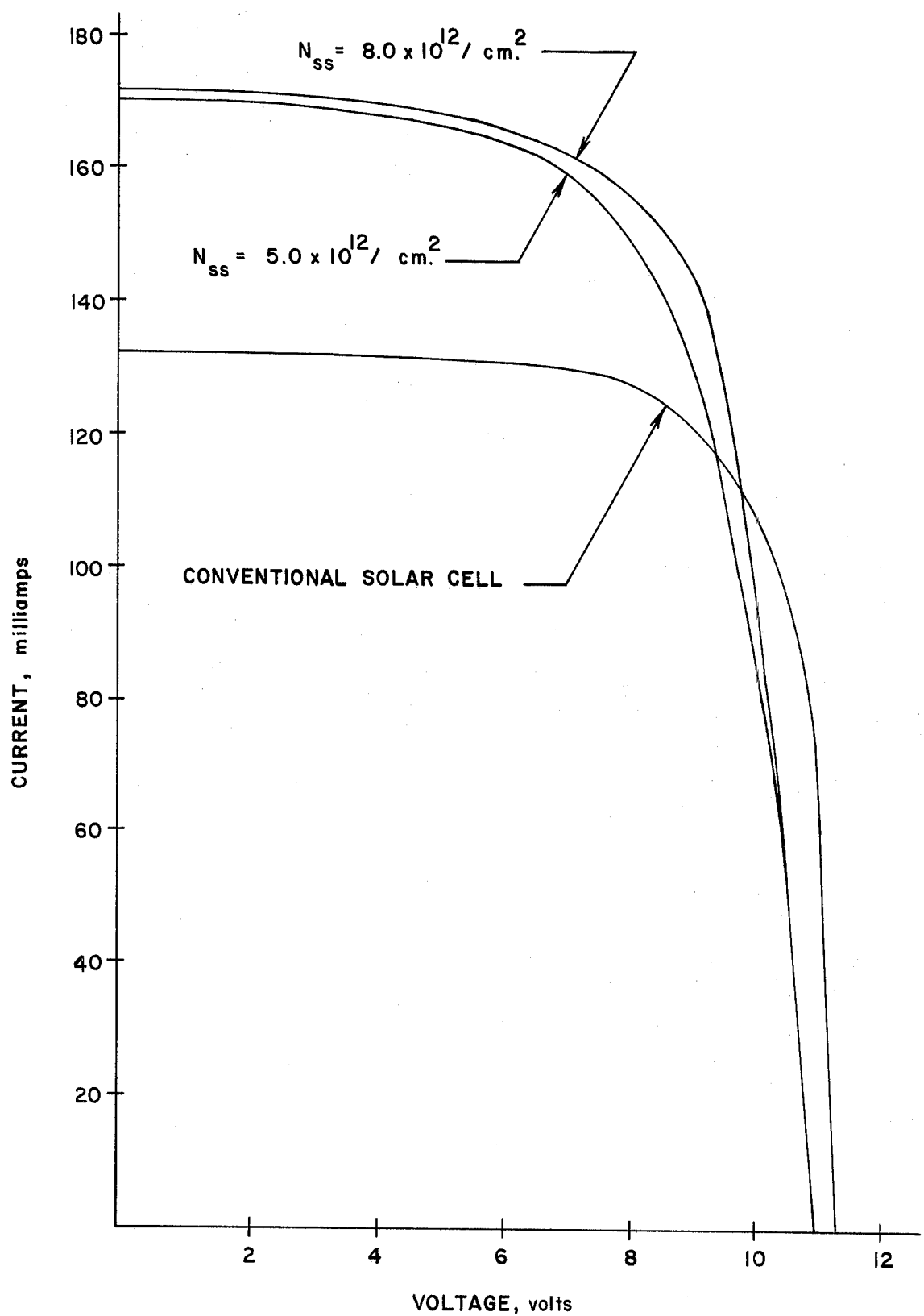
FIG. 5 is a graph of I-V characteristics for a conventional p-n junction solar cell and for induced junction solar cells of different inversion layer charge densities.

The next major step is comprised of chemical vapor deposition of an $SiO_2$ layer using first a 10:1 mixture of gaseous $SiH_4$ and oxygen to produce a thin film of oxide (about 200A) and then a 1:10 mixture of gaseous $SiH_4$ and oxygen to produce an oxide layer of about 3000 A. The CVD layer is then subjected to a process of slow boron ion implantation to a concentration of from $5 \times 10^{12}$ to $8 \times 10^{12}$ per square centimeter or higher. FIG. 4 illustrates the higher current collecting efficiency possible with higher charge densities. It also shows that increasing the charge density produces a larger percentage change in collected current for larger stripe spacings. FIG. 5 shows the I–V characteristic of a conventional p-n junction solar cell and the I–V characteristics for induced junction solar cells using the diamond collector pattern of FIG. 2 and having a charge density of $5 \times 10^{12}/cm^2$ and $8 \times 10^{12}/cm^2$. Based on the data of these two figures, it appears that the higher the charge density and the smaller the spacing between collector stripes, the more efficient the solar cell with a practical optimum in stripe spacing of 10 mils center to center using the diamond collector pattern of FIG. 2, and a charge density of about $5 \times 10^{12}$ to $8 \times 10^{12}/cm^2$, although it is believed that while an insufficient charge density may be implanted, it is not possible to implant too high a concentration for the reason that any excess is unstable. In fact it is believed that a charge concentration will not be stable above an amount which is less than sufficient for optimum conversion of solar energy to electrical current. It is for that reason that the current collecting pattern must be so carefully designed such that the primary collecting stripes are crossed by auxiliary collecting stripes with optimum spacing (10 mils for stripes 1 mil wide). If the stripes are further apart, collecting efficiency drops, and if the stripes are closer and not made correspondingly narrower, efficiency drops. The diamond shaped bus bar is also designed for maximum collecting efficiency.

The third step illustrated in FIG. 3 is to etch the CVD oxide layer and the underlying $SiO_2$ film over the primary ($n^+$) collecting stripes. The fourth step is to metallize the entire obverse side of the structure with aluminum. The collecting bus bar pattern is then formed in step 5 by using photo-resist techniques to etch away undesired aluminum areas. Following that, the reverse side is metallized.

While the foregoing description has been directed to fabrication of only one solar cell, it is obvious that in practice a large number of solar cells can be fabricated simultaneously on a wafer, and that they can be interconnected by a suitable metallization pattern or separated into individual solar cells by scribing. Consequently, although a particular embodiment of this invention has been described and illustrated herein for one solar cell, it is recognized that the solar cell may be but one of the array. It is also recognized that the same technique can be applied to different semiconductor substrate material, and even with different dielectric films, such as a nitride of the semiconductor material, with very little modification. A different polarity in the substrate requires different charges in the outer dielectric layer, and since it is more difficult to implant negative ions, an p-type substrate is preferred. Also because inherent defects in the dielectric film will be positive in polarity, it is preferred to implant positive ions, thus using the inherent defects to advantage, although such defects are not essential; implanted ions can be relied upon for the entire charge field. Such modifications will readily occur to those skilled in the art. It is therefore intended that the claims be interpreted to cover such modifications and equivalents thereof.

What is claimed is:

1. An induced junction solar cell comprising
a substrate of p-type semiconductor material,
a pattern of current collecting stripes on one broad side of said substrate diffused with n-type impurities,
a film of dielectric material on said one side of said substrate,
a layer of dielectric material produced over said dielectric film,
a uniform concentration of positive ions implanted in said dielectric layer,
a pattern of metal conductors in ohmic contact with said current collecting stripes, and
a film of metal in ohmic contact with said substrate on the other side of said substrate opposite said one side.

2. An induced junction solar cell as defined in claim 1 wherein said uniform concentration of ions is in excess of $0.5 \times 10^{12}$ per square centimeter.

3. An induced junction solar cell as defined in claim 1 wherein said uniform concentration of ions is about $8 \times 10^{12}$ per square centimeter.

4. An induced junction solar cell as defined in claim 1 wherein said uniform concentration of ions is a maximum stable concentration produced by implanting ions in excess of that necessary to produce a stable concentration.

5. An induced junction solar cell as defined in claim 1 wherein said film is a thermally grown oxide of said semiconductor material, and said layer is an oxide of said semiconductor material produced by chemical vapor deposition with inherent defects which function as deep traps for spontaneous positive charges.

6. An induced junction solar cell as defined in claim 5 wherein said uniform concentration of ions is in excess of $0.5 \times 10^{12}$ per square centimeter.

7. An induced junction solar cell as defined in claim 5 wherein said uniform concentration of ions is about $8 \times 10^{12}$ per square centimeter.

8. An induced junction solar cell as defined in claim 5 wherein said uniform concentration of ions is a maximum stable concentration produced by implanting ions in excess of that necessary to produce a stable concentration.

9. An induced junction solar cell as defined in claim 1 wherein said pattern of stripes is comprised of crisscrossed stripes, each about 1 mil wide, said stripes being uniformly spaced about 10 mils apart in both orthogonal directions.

10. An induced junction solar cell comprising
a substrate of semiconductor material of a given conductivity type having a broad obverse side through which solar energy is to be received and a reverse side opposite said obverse side,
a crisscrossed grid of current collecting stripes of opposite conductivity type diffused into said substrate on the obverse side,
a thin film of dielectric material on the obverse side of said substrate over said collecting stripes and all areas between said collecting stripes except over collecting stripes of said crisscross pattern which are oriented in one direction,
a layer of dielectric material on said thin film having a maximum concentration of stable charges of said given conductivity type distributed throughout to induce a field of opposite charge in said substrate near the surface thereof, except over collecting stripes of said crisscross pattern which are oriented in said one direction,
a pattern of metal stripes in ohmic contact with said collecting stripes oriented in said one direction and a bus bar interconnecting said metal stripes, and
a film of metal in ohmic contact with said substrate on the reverse side thereof.

11. An induced junction solar cell as defined in claim 10 wherein said maximum concentration of stable charges of said given conductivity type is comprised of ions implanted in said dielectric layer.

12. An induced junction solar cell as defined in claim 11 wherein said dielectric layer is comprised of an oxide produced by chemical vapor deposition, whereby said layer is provided with inherent defects that function as deep traps for spontaneous positive charges.

13. A method for the preparation of semiconductor material of a given conductivity type for a solar cell using an induced junction in a substrate of said semiconductor material for the conversion of radiation into electrical energy, comprising diffusing a pattern of stripes on a broad surface of said substrate, said stripes being of a conductivity type opposite said given conductivity type, producing a thin uniform dielectric film over said surface, producing a uniform dielectric layer over said film, implanting a uniform concentration of ions in said dielectric layer, said ions being of the same polarity as the conductivity of said semiconductor material, and producing a pattern of metal conductors in ohmic contact with stripes of said pattern to collect current from all stripes and a bus bar to collect current from all conductors.

14. A method as defined in claim 13 wherein said uniform concentration of ions is in excess of $0.5 \times 10^{12}$ per square centimeter.

15. A method as defined in claim 13 wherein said uniform concentration of ions is about $8 \times 10^{12}$ per square centimeter.

16. A method as defined in claim 13 wherein said uniform concentration of ions is a maximum stable concentration produced by implanting ions in excess of that necessary to produce a stable concentration.

17. A method as defined in claim 13 wherein said semiconductor material is silicon, said thin dielectric film is produced by thermal oxidation on said surface and said dielectric layer is produced by chemical vapor deposition of silicon dioxide on said thin film.

18. A method as defined in claim 17 wherein said semiconductor material is p-type silicon, and said ions implanted are positive.

19. A method as defined in claim 18 wherein said uniform concentration of ions is in excess of $0.5 \times 10^{12}$ per square centimeter.

20. A method as defined in claim 18 wherein said uniform concentration of ions is about $8 \times 10^{12}$ per square centimeter.

21. A method as defined in claim 18 wherein said uniform concentration of ions is a maximum stable concentration produced by implanting ions in excess of that necessary to produce a stable concentration.

* * * * *